US012799300B2

(12) United States Patent
Esser-Kahn et al.

(10) Patent No.: US 12,799,300 B2
(45) Date of Patent: Nov. 17, 2026

(54) MECHANICALLY ADAPTIVE MATERIALS

(71) Applicant: The University of Chicago, Chicago, IL (US)

(72) Inventors: Aaron Esser-Kahn, Chicago, IL (US); Jun Wang, Chicago, IL (US); Zhao Wang, Chicago, IL (US); Jorge Luis Ayarza-Leon, Chicago, IL (US)

(73) Assignee: The University of Chicago, Chicago, IL (US)

( * ) Notice: Subject to any disclaimer, the term of this patent is extended or adjusted under 35 U.S.C. 154(b) by 813 days.

(21) Appl. No.: 18/172,146

(22) Filed: Feb. 21, 2023

(65) Prior Publication Data

US 2023/0279197 A1 Sep. 7, 2023

Related U.S. Application Data

(60) Provisional application No. 63/268,256, filed on Feb. 18, 2022.

(51) Int. Cl.

| | |
|---|---|
| ***C08K 3/22*** | (2006.01) |
| ***C08F 12/08*** | (2006.01) |
| ***C08F 20/14*** | (2006.01) |
| ***H10N 30/00*** | (2023.01) |
| ***H10N 30/85*** | (2023.01) |

(52) U.S. Cl.

CPC ................ *C08K 3/22* (2013.01); *C08F 12/08* (2013.01); *C08F 20/14* (2013.01); *H10N 30/702* (2024.05); *H10N 30/85* (2023.02); *C08F 2810/20* (2013.01); *C08F 2810/40* (2013.01); *C08K 2003/2296* (2013.01); *C08K 2201/001* (2013.01); *C08K 2201/011* (2013.01)

(58) Field of Classification Search

CPC ........ C08K 3/22; H10N 30/85; H10N 30/702; C08F 12/08; C08F 20/14

USPC .................................................. 252/62.9 PZ

See application file for complete search history.

(56) References Cited

U.S. PATENT DOCUMENTS

| | | |
|---|---|---|
| 2019/0190068 A1 | 6/2019 | Lee et al. |
| 2019/0237803 A1 | 8/2019 | Gerasopoulos et al. |

OTHER PUBLICATIONS

Ayarza, J., et al., "Mechanically Promoted Synthesis of Polymer Organogels via Disulfide Bond Cross-Linking", ACS Macro Letters, 2021, vol. 10(7), pp. 799-804.

(Continued)

*Primary Examiner* — Anita Nassiri-Motlagh

(74) *Attorney, Agent, or Firm* — Weaver Austin Villeneuve & Sampson LLP

(57) ABSTRACT

Provided are mechanically adaptive materials that include a composite gel that is responsive to input energy. In some embodiments, input vibrational energy results in strengthening the composite gel. The strengthening may be reversible or irreversible according to various embodiments. In some embodiments, input vibrational energy generates chemical promotors for cross-linking reactions and/or linear polymerization via mechano-chemical transducers. In some embodiments, an applied shear stress is used to control charge generation and generate chemical promoters for cross-linking and/or linear polymerization. In some embodiments, the composite gels include a polymer network and/or polymer network precursors, reactive groups and/or linkers formed by reaction of the reactive groups, and a mechano-chemical transducer. Also provided are methods of mechanically promoted synthesis of polymers and polymer gels.

16 Claims, 12 Drawing Sheets

(56) References Cited

OTHER PUBLICATIONS

EP Office Action dated Jul. 16, 2025 in EP Application No. 23901697.5.
International Preliminary Report on Patentability and Written Opinion dated Jun. 19, 2025 in PCT Application No. PCT/US2023/083228.
International Search Report and Written Opinion dated Apr. 3, 2024 in PCT Application No. PCT/US2023/083228.
Invitation to Pay Additional Fees dated Feb. 13, 2024 in PCT Application No. PCT/US2023/083228.
Kim, H., et al., "Stress-activated friction in sheared suspensions probed with piezoelectric nanoparticles", PNAS, 2023, vol. 120(49), pp. e2310088120 (1-6) https://doi.org/10.1073/pnas.2310088120.
U.S. Appl. No. 19/136,804, inventors Esser-Kahn A et al., filed Jun. 6, 2025.
Wang Z., et al., "Bio-inspired Mechanically Adaptive Materials Through Vibration-induced Crosslinking," Nature Materials, 2021, vol. 20, pp. 869-874.

mercapto-PMMA mercapto-PMA mercapto-PS

MECHANICALLY ADAPTIVE MATERIALS

STATEMENT OF GOVERNMENT SUPPORT

This invention was made with government support under W911NF-17-1-0598 awarded by the Army Research Laboratory-Army Research Office, and 1710116 awarded by the National Science Foundation. The government has certain rights in the invention.

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD

The present disclosure relates to mechanically adaptive materials. In particular, it relates to materials that can adapt to their environments via vibration-induced cross-linking.

BACKGROUND

Materials in everyday use are subject to degrading conditions including mechanical vibration. However, few materials can adapt dynamically to their mechanical environment.

SUMMARY

Aspects of the disclosure relate to mechanically adaptive materials that include a composite gel that is responsive to vibrational input energy. Input vibrational energy results in strengthening of the composite gel. The strengthening may be reversible or irreversible according to various embodiments. In some embodiments, input vibrational energy generates chemical promotors for cross-linking reactions and/or linear polymerization via mechano-chemical transducers. In some embodiments, the composite gels include a polymer network and/or polymer network precursors, reactive groups and/or linkers formed by reaction of the reactive groups, and a mechano-chemical transducer. Also described are methods of mechanically promoted synthesis of polymers and polymer gels.

One aspect of the disclosure relates to a composition including: a polymer network, reactive groups and/or linkers formed by reaction of the reactive groups, and a mechano-chemical transducer dispersed in the composition. In some embodiments, the reactive groups include thiol groups and one or both of alkene and alkyne groups. In some such embodiments, the linkers include thioether groups. In some embodiments, the reactive groups include thiol groups. In some such embodiments, the linkers include disulfide bonds.

In some embodiments, a free radical mechanism is used to initiate polymerization and/or crosslinking. Further examples of reactive groups can include (meth)acrylates, (meth)acrylamides, alkenes, alkynes, vinyl groups, and allyl groups.

In some embodiments, the mechano-chemical transducer is a piezoelectric material. In some such embodiments, the mechano-chemical transducer includes piezoelectric nanostructures. In some such embodiments, the piezoelectric nanostructures include zinc oxide (ZnO).

In some embodiments, the mechano-chemical transducer is responsive to ultrasound and/or vibrations at sub-ultrasound frequencies to induce the reaction of reactive groups. In some embodiments, the mechano-chemical transducer is responsive to vibrations at 10 hertz (Hz) to 6000 Hz to induce the reaction of the reactive groups.

In some embodiments, the composition is responsive to stress to strengthen selectively according to the distribution of stress in the composition.

In some embodiments, the polymer network includes crosslinks formed by reaction of the reactive groups. In some embodiments, the composition further includes a primary polymer network. In some embodiments, the primary polymer network includes methyl-cellulose.

In some embodiments, the reaction is irreversible. In some embodiments, the reaction is reversible.

In some embodiments, the composition is an organo-gel.

Another aspect of the disclosure relates to a organo-gel composition that responds to input vibrational energy by increasing crosslinking in the composition, wherein the crosslinks remain after the input energy is removed. In some embodiments, the crosslinking is reversible. In some embodiments, the crosslinking is irreversible. In some embodiments, the response varies based on frequency of the vibrational energy. In some embodiments, wherein the response varies based on input time of the vibrational energy. In some embodiments, the response varies based on total input energy.

Another aspect of the disclosure relates to a method including providing piezoelectric nanoparticles and monomers; and subjecting the piezoelectric particles and monomers to mechanical vibration to thereby form a gel from the monomers. Other mechano-chemical transducers may be used as appropriate.

Another aspect of the disclosure relates to a method including providing a first composition including a primary organo-gel, cross-linkable monomers, and piezoelectric particles; and subjecting the first composition to mechanical vibration to cross-link the cross-linkable nanoparticles and form a double network. Other mechano-chemical transducers may be used as appropriate.

These and other aspects of the disclosure are described further below with reference to the drawings.

DETAILED DESCRIPTION

The present disclosure relates to mechanically adaptive materials. In some embodiments, the materials include a composite gel that is responsive to vibrational input energy. Input vibrational energy results in strengthening the composite gel. The strengthening may be reversible or irreversible according to various embodiments. In some embodiments, input vibrational energy generates chemical promotors for cross-linking reactions and/or linear polymerization via mechano-chemical transducers. In some embodiments, an applied shear stress that introduces mechanical vibrational energy is used to induce charge generation and generate chemical promoters for cross-linking and/or linear polymerization. In some embodiments, the composite gels include a polymer network and/or polymer network precursors, reactive groups and/or linkers formed by reaction of the reactive groups, and a mechano-chemical transducer. Also provided are methods of mechanically promoted synthesis of polymers and polymer gels.

Figure 1:
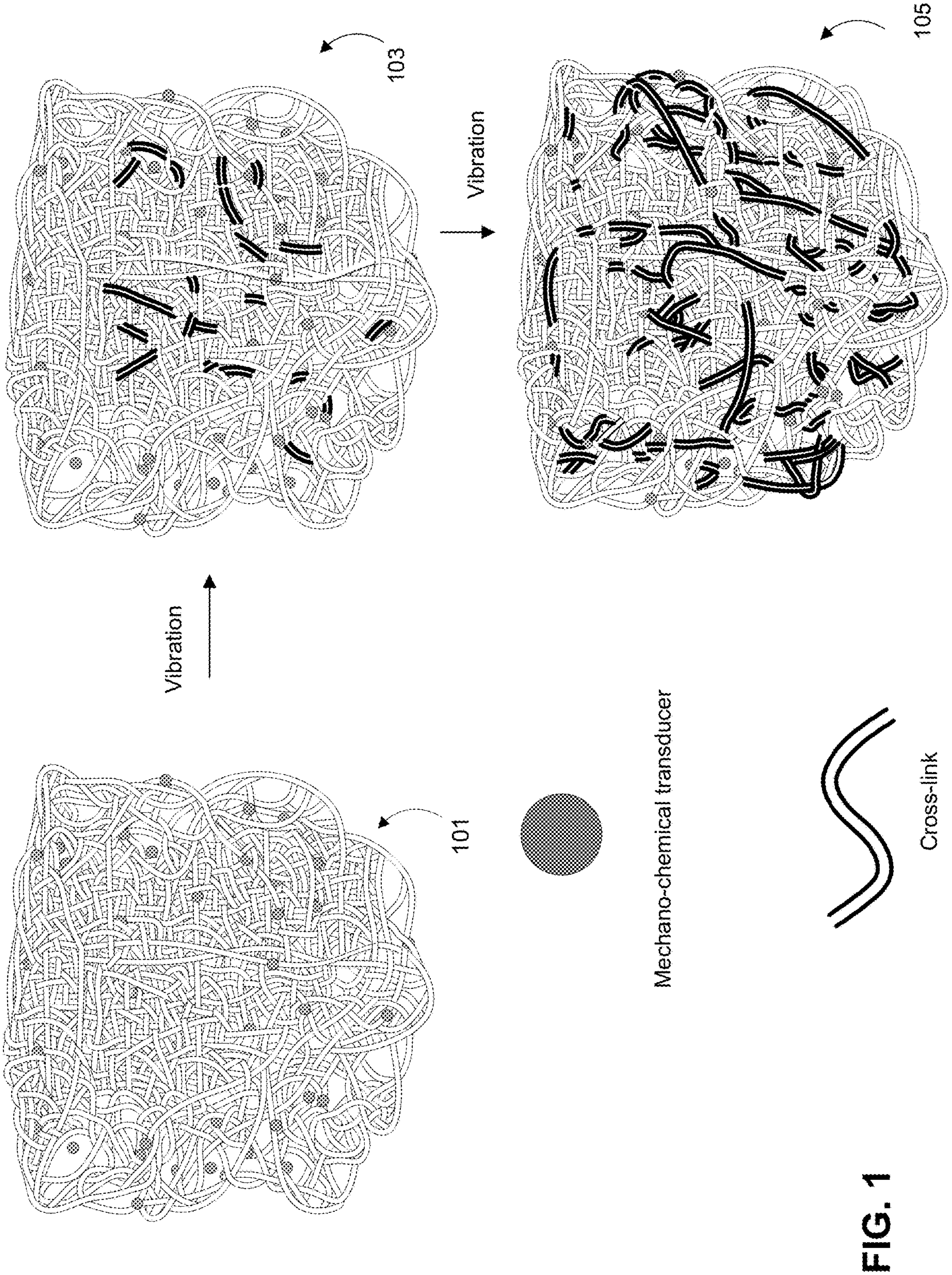
FIG. 1 is a schematic illustration of self-strengthening in a mechanically adaptive material according to certain embodiments.

FIG. 1 illustrates self-strengthening in a mechanically adaptive material according to certain embodiments. At 101, a polymer gel is shown prior to being subject to input vibrational energy. It includes polymer chains, reactive groups, and a mechano-chemical transducer. At 103, the polymer gel is shown after being subject to vibrational energy and includes cross-links. At 105, the degree of cross-linking is increased after further vibration. As discussed below, other mechanisms of subjecting the mechano-chemical transducers to mechanical energy such as oscillatory shear may be used in addition to or instead of vibration.

According to various embodiments, a material can adapt to the mechanical environment it experiences. In some embodiments, the material alters its response as a function of frequency and time. Further, the response is non-transient and persists after the stimulation is removed. In this manner, the synthetic materials described herein adapt to external mechanical forces in a way that resembles the bone remodeling behavior.

The mechano-chemical transducer may take the form of piezoelectric particles that can directly transduce mechanical energy into chemical energy. Examples include zinc oxide (ZnO) particles with further examples given below. In some embodiments, the particles are nanoparticles, which can be easily dispersed within the polymer to transduce energy at reactive sites throughout the composite. Additional description of appropriate mechano-chemical transducers is provided below.

In some embodiments, the mechano-chemical transducers are responsive to ultrasound (above 20,000 hertz (Hz)). In some embodiments, the mechano-chemical transducers are responsive to vibrations at frequencies lower than ultrasound (20,000 Hz and below) including low-to-mid-range frequencies, e.g., from 10 hertz (Hz) to 6000 Hz. Many commonly encountered vibration sources are within this range. For examples, airplanes and helicopters vibrate at 15-1325 Hz, engines, turbines, and compressors at 400-600 Hz, and household appliances at 25-215 Hz.

In some embodiments, the mechano-induced polymerization and/or cross-linking reactions can involve the reduction of a metal species to mediate energy transfer. Examples include copper(I) (Cu(I))-mediated atom transfer radical polymerization (ATRP), Cu(I) azide-alkyne cycloaddition (CuAAC) step-growth polymerization, and iron (Fe)-mediated free-radical polymerization. However, in some embodiments, a mechanism that does not involve a metal species is used. In such embodiments, the composite may be free of metal species. Examples of such mechanisms include step-growth thiol-ene polymerization and disulfide bond cross-linking.

Figure 2:
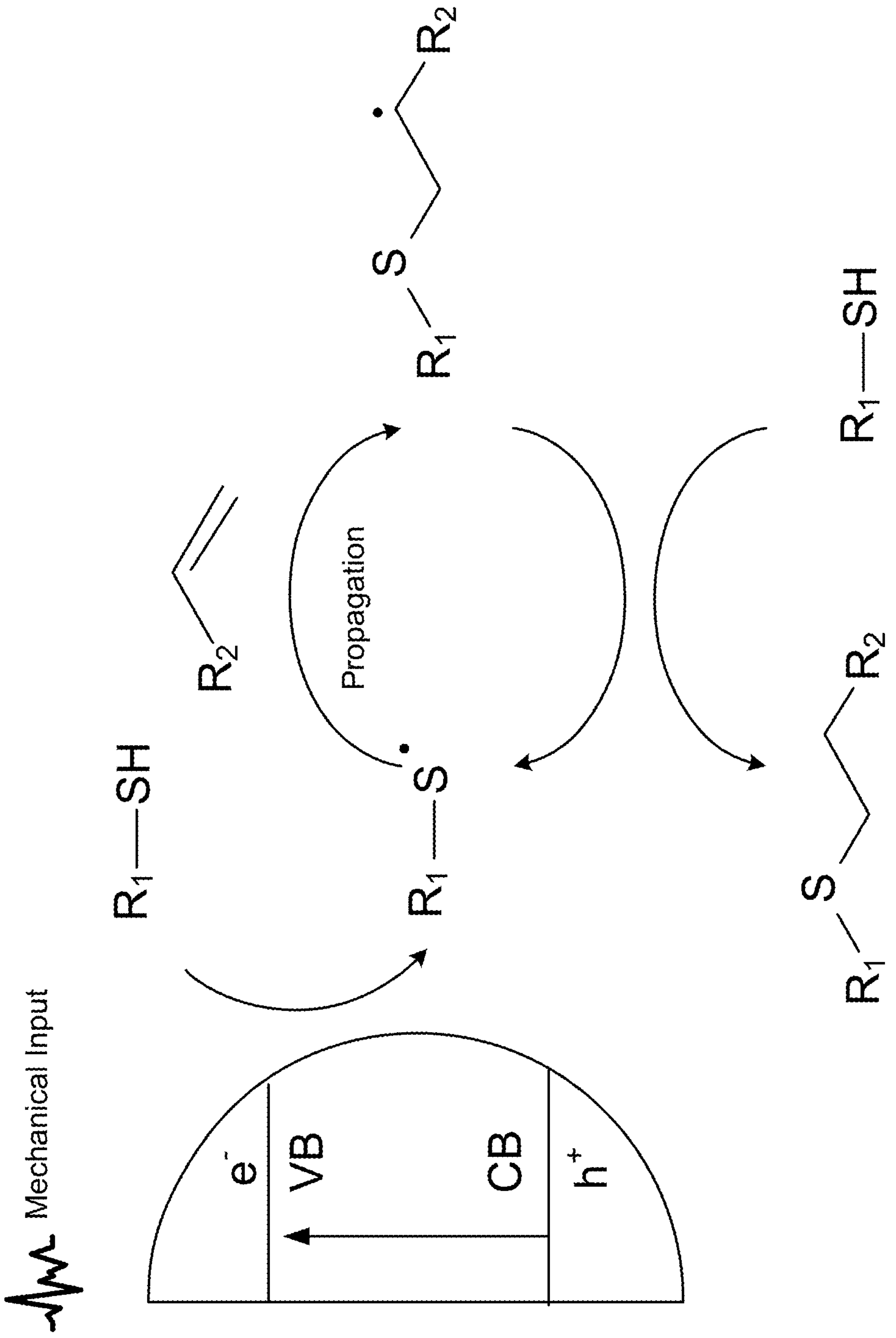
FIG. 2 shows a possible reaction mechanism for a mechanically mediated thiol-ene reaction.

In some embodiments, the adaptive materials self-strengthen via a piezoelectric-mediated reaction. FIG. 2 shows a possible reaction mechanism for a mechanically mediated thiol-ene reaction. According to various embodiments, the composition may include a polymer or linking agent with a thiol group and a polymer or linking agent with a double bond. In some embodiments, the composition includes thioether bonds as products of thiol-ene reactions. In some embodiments, the adaptive materials self-strengthen via disulfide bond crosslinking. According to various embodiments, the composition may include a polymer or linking agent with a thiol group. In some embodiments, the composition includes thioether disulfide bonds as products of disulfide bond crosslinking.

According to various embodiments, gel compositions are provided. The gels may be formed from crosslinked polymers. In some embodiments, a double network gel is provided including a primary gel (e.g., a methylcellulose (MC) gel) and a network formed from piezo-mediated crosslinked polymers. Other examples of primary gels include polyurethane, siloxanes such polydimethylsiloxane, and starch.

Mechanically Controlled Polymerization, Gelation, and Gel-Strengthening

One aspect of the disclosure relates to mechanically controlled polymerization. In some embodiments, a thiol-ene 'click' reaction between thiols and alkenes or alkynes may be used with a mechano-chemical actuator for linear polymerization and/or crosslinking. The following reactive groups (thiol and alkene (A) or alkyne (B)) may be used form thioethers.

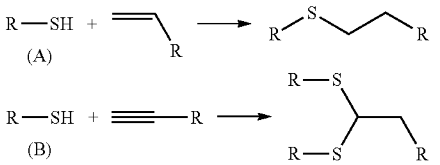

Figure 3A:
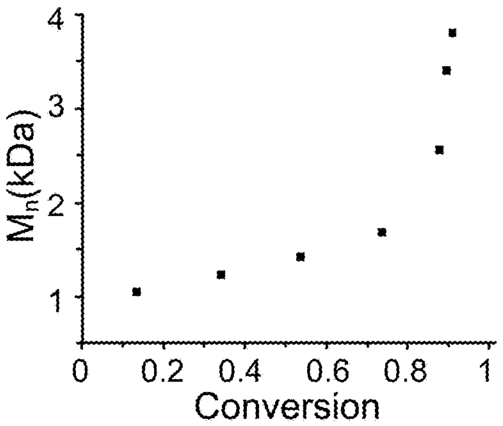
FIGS. 3*a* and 3*b* show evolution of number average molecular weight (Mn) over increasing monomer conversion and gel permeation chromatography (GPC) traces, respectively, at 1 h intervals of a zinc oxide (ZnO)-mediated reaction between tri(ethylene glycol) divinyl ether (TEGDE) and 2,2'-(ethylenedioxy) diethanethiol (EDT).
Figure 3B:
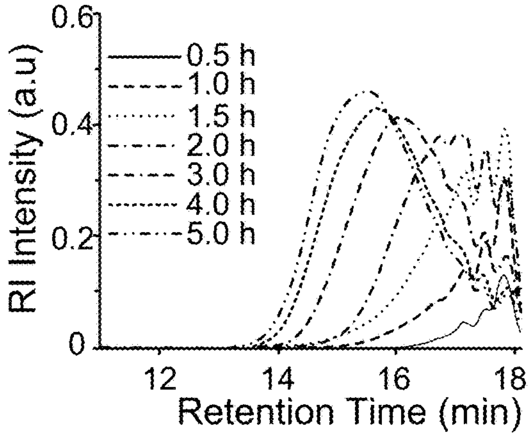
Figure 3C:
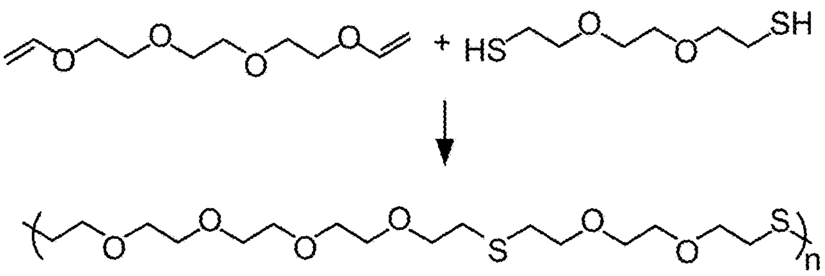
FIG. 3*c* shows linear polymerization between TEGDE and EDT.

In some embodiments, thiol-ene click components are used with ZnO as a piezo-mediator at mid-range vibrational frequencies. FIGS. 3*a* and 3*b* show evolution of number average molecular weight (Mn) over increasing monomer conversion and gel permeation chromatography (GPC) traces, respectively, at 1 h intervals of a ZnO-mediated reaction between tri(ethylene glycol) divinyl ether (TEGDE) and 2,2'-(ethylenedioxy) diethanethiol (EDT). The reaction was conducted with the ZnO mechano-chemical nanoparticle under vibration (2000 Hz, 1.2 N). Light was removed to eliminate other sources of energy. FIG. 3*c* shows linear polymerization between TEGDE and EDT.

Figure 3D:
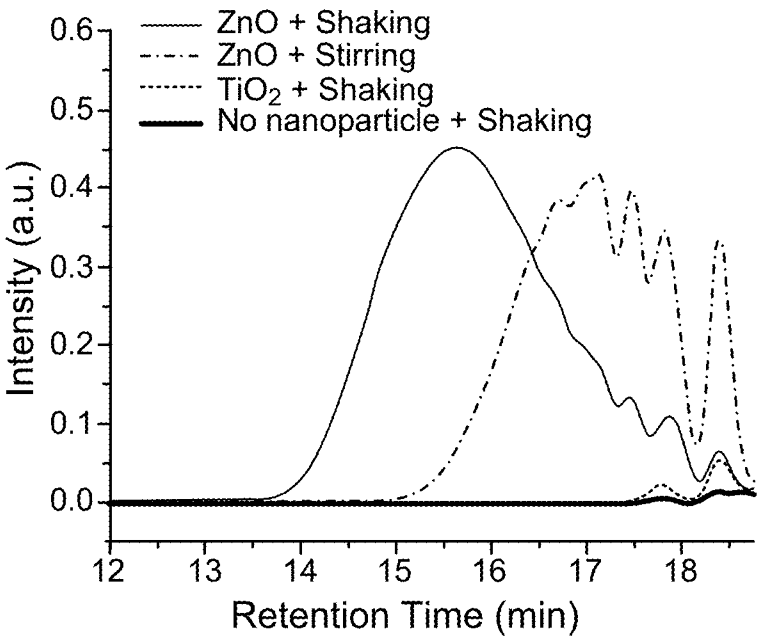
FIG. 3*d* shows GPC traces of the following four systems that include monomers: ZnO nanoparticles+shaking, ZnO nanoparticles+stirring, $TiO_2$ nanoparticles+shaking, and no nanoparticles or shaking.

FIG. 3*d* shows GPC traces of four systems including monomers: ZnO nanoparticles+shaking, ZnO nanoparticles+stirring, $TiO_2$ nanoparticles+shaking, and no nanoparticles or shaking. Only in the presence of ZnO particles, monomer, and vibration, was a polymer (number-averaged molecular mass, Mn=3800 Da) obtained with very high monomer conversion (95%), suggesting a similar kinetics to step-growth polymerization. In contrast, no polymerization was observed without the ZnO nanoparticles or in the presence of non-piezoelectric $TiO_2$ nanoparticles. This indicates that ZnO initiates the polymerization.

While background polymerization in the presence of ZnO by stirring (400 rpm) occurs, the mechanical activation from stirring is insufficient to achieve the same reactivity as from mechanical vibration. 1H NMR and MALDI-TOF mass spectrometry (MS) confirmed formation of the polythioether.

Figure 4A:
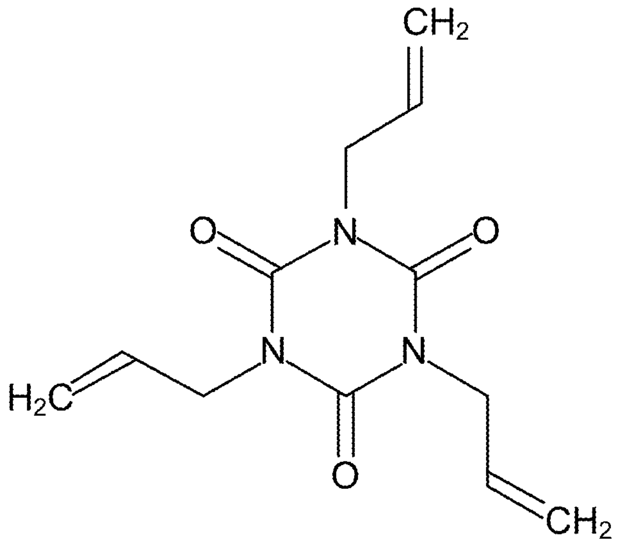
FIG. 4*a* shows the structure of 1,3,5-triallyl-1,3,5-triazine-2,4,6(1H,3H,5H)-trione (TTT).
Figure 4B:
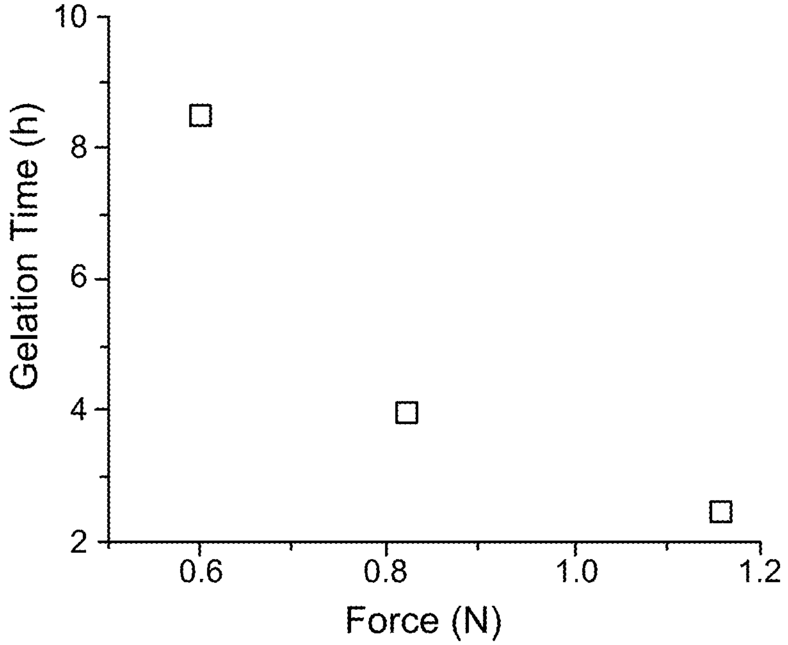
FIG. 4*b* shows gelation time as a function of force for ZnO particles and monomers of TTT and EDT subject to mechanical vibration.

Another aspect of the disclosure relates to mechanically controlled crosslinking and gelation. 1,3,5-triallyl-1,3,5-triazine-2,4,6(1H,3H,5H)-trione (TTT; FIG. 4*a*) was used to create a crosslinked network. ZnO particles and monomers of TTT and EDT were subject to mechanical vibration, leading to a gelation event. The resulting rubber-like gel sample showed a storage modulus of 89 kPa at 1 Hz. Gelation rate was measured at different input force, which was varied by controlling the acceleration and frequency of the shaking oscillator. The results shown in FIG. 4*b* indicate that higher force and mechanical energy results in a higher gelation rate. This confirms that ZnO acts as mechano-chemical transducer taking mid-range frequency vibration and creating a material with a modulus as a function of shaking frequency and force.

The polymerization mechanisms of mechanically mediated thiol-ene reaction is distinct from piezo-mediated polymerization that requires reduction of metal species to mediate energy transfer. While the methods described here are not limited to a particular mechanism, a mechanism according to certain embodiments is shown in FIG. 2. As shown in FIG. 2, under deformation, piezoelectric ZnO generates a piezoelectric potential at the surface to induce the formation of thiyl radical. This promotes further propagation with an—ene functional group via an anti-Markovnikov addition to form a carbon-centered radical. A chain-transfer step removes a hydrogen radical from a thiol, which can subsequently participate in multiple propagation steps.

Table 1, below, summarizes the reactivity different alkenes (propyl vinyl ether>1-octene~vinyl propionate>allyl butyl ether). For all alkenes, the control experiments showed much less reactivity than the reactions under shaking.

| Alkene | ZnO | Vibration (2000 Hz) | Time (h) | Alkene Conversion (%) (determined by $^1$H NMR) |
|---|---|---|---|---|
| Propyl vinyl ether | Yes | Yes | 1.5 | 53 |
| | Yes | No | 1.5 | 23 |
| | No | No | 1.5 | 19 |
| 1-octene | Yes | Yes | 3 | 44 |
| | Yes | No | 3 | 19 |
| | No | No | 3 | 11 |
| Vinyl propionate | Yes | Yes | 3 | 40 |
| | Yes | No | 3 | 23 |
| | No | No | 3 | 5 |
| Allyl butyl ether | Yes | Yes | 3 | 30 |
| | Yes | No | 3 | 20 |
| | No | No | 3 | 10 |

As described above, the thiol-ene reactive chemistry is used with ZnO nanoparticles in certain embodiments. Piezoelectric $BaTiO_3$ was compared with ZnO in the polymerization of TEGDE and EDT and the reaction of propyl vinyl ether and EDT. Little reactivity was observed for $BaTiO_3$ compared with ZnO. This indicates that the interaction between ZnO surface and monomer is important for the reaction.

Figure 5:
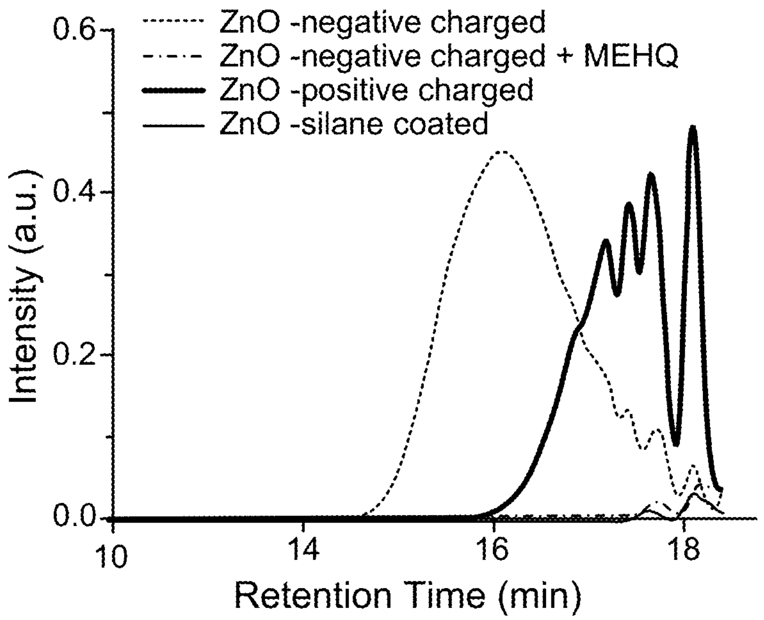
FIG. 5 shows GPC traces of thiol-ene polymerization using different ZnO nanoparticles.

FIG. 5 shows GPC traces of thiol-ene polymerization using different ZnO nanoparticles. Positively charged, negatively charged, and silane-coated ZnO have a zeta potential of 6.9 mV, −24.0 mV, and −22.6 mV, respectively. Also shown is a reaction using negative charged ZnO with the addition of 4-methoxyphenol (MEHQ).

The results in FIG. 5 show that a strong negative charge of the ZnO nanoparticles is important for the reaction. The lower reactivity with the addition of MEHQ, a stabilizer known to inhibit peroxide formation and suppress free radical polymerization reactions, indicates that the reaction is mediated by a radical transfer process. ZnO coated with silane (1 wt %, — 0.2 nm) with a similar zeta potential did not result in polymerization despite generating a potential upon vibration, which suggests that the reaction takes place at or near the surface of the particles. The results shown in FIG. 5 (and the lower reactivity of $BaTiO_3$) indicate that both negative charges and direct interaction of ZnO with thiol species are responsible for the generation of thiol radicals that undergo a thiol-ene polymerization.

In some embodiments, crosslinking of a second network within a solvent may be performed. This can increase diffusion of the mechano-chemical transducer, so that mechanical adaptation can occur throughout the material. In some embodiments, an organo-gel including thiol-ene reactive groups is used. In one example, dimethylformamide (DMF) is used as solvent with a methyl-cellulose primary gel. Other solvents may be used as appropriate other gels.

In an example, a gel having an initial composition of TTT (15 wt %), EDT (16 wt %), ZnO, and a methyl-cellulose organo-gelator (2 wt %) was used. The components remained fixed within the primary organo-gel, with the composite forming a crosslinked double network under vibration. Only composites that contained ZnO and were subject to mechanical oscillation increased their modulus during the 16 h stimulation (2000 Hz, 1.2 N). The material increased its strength over a control gel which contain all the same components but were not subject to mechanical oscillation.

Figure 6A:
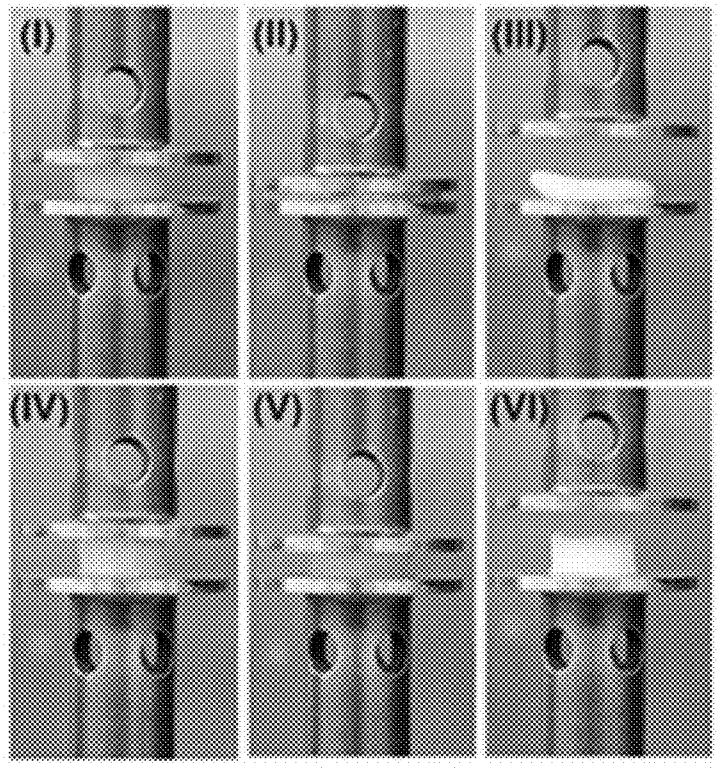
FIG. 6*a* shows images of a control gel and a strengthened gel before, during, and after a force test.

FIG. 6*a* shows images of a compression test on a rheometer. Images (I-III) are of a control gel without being subject to vibrations and images (IV-VI) of a strengthened gel after applied vibration. Images were captured before (I, IV), during (II, V) and after (III, VI) applying a 10 N axial compressive force on a rheometer. Comparing image (VI) to image (III), only the strengthened gel retained its shape after compression.

Figure 6B:
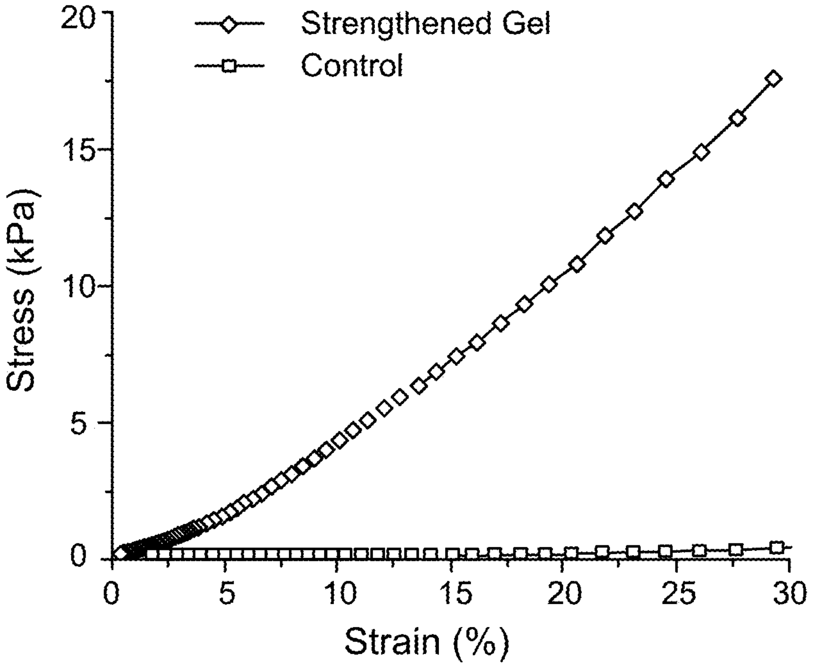
FIG. 6*b* shows stress-strain curves for control and strengthened gels.

Stress-strain curves for the control and strengthened gels in a compression test under constant rate (0.01 mm/s) are shown in FIG. 6*b*. The strengthened sample retained its shape and showed a compression stress at 30% strain of 18 kPa. In contrast, the control sample without vibration showed a low resistance and irreversible deformation under the applied force. The difference between the two samples indicates a 36-fold increase in stress response after being subject to vibration. This indicates the strengthening of the gel with vibration is the result of higher crosslinking density via the formation of the second thiol-ene network in the strengthened gel.

FIGS. 7*a*-7*d* show storage modulus (G') and change in storage modulus (ΔG') showing adaption of the organo-gel modulus to different mechanical inputs. Storage modulus can be used to measure relative gel strength. Samples were vibrated at 2000 Hz, at 0.8 N for 8 h. Organo-gels without the ZnO (i.e., a sample with no particles "MC" and a sample with $TiO_2$ particles "MC-$TiO_2$") remained weak after vibration. When ZnO is included, the resulting gel shows an increase in G' (see FIG. 7*a*; control bars on left, vibration on right). These results indicate that ZnO acts as mechanical transducer generating new crosslinks within the material only under mechanical vibration.

In some embodiments, the material adapts its strength to input energy. Parameters evaluated include applied force, frequency, and time. To evaluate the samples while minimizing the differences in experimental conditions, storage modulus change (ΔG') was used to describe the strengthening contribution from mechanical vibration, calculated by the following formula: $\Delta G' = G'_{vibration} - G'_{control}$ where $G'_{vibration}$ is the storage modulus of a sample after vibrational strengthening and $G'_{control}$ is the storage modulus of an identical sample and conditions without application of vibration.

Figure 7A:
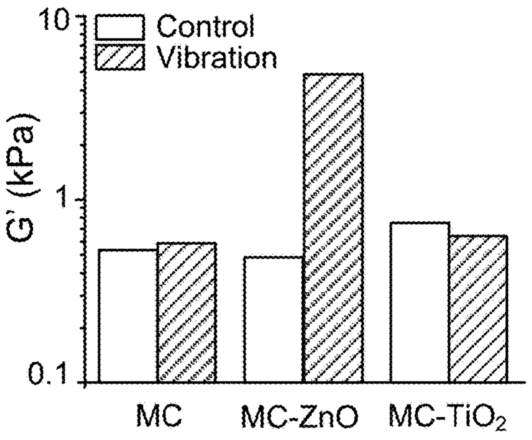
FIG. 7*a* shows storage modulus (G') for different organogel systems under without and with vibration.
Figure 7B:
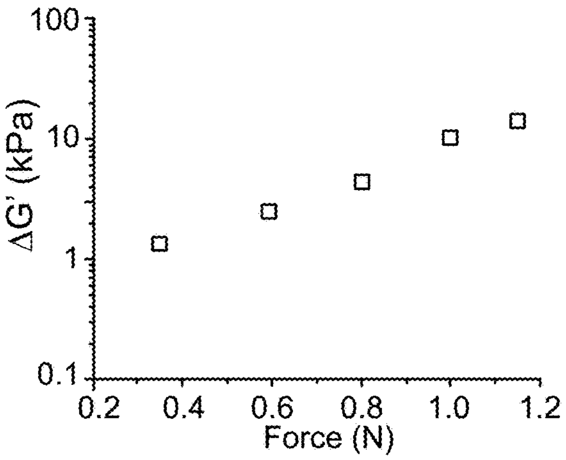
FIGS. 7*b*-7*d* show change in storage modulus (ΔG') for different mechanical inputs.

FIG. 7*b* shows ΔG' as a function of force for a fixed period of time at a fixed frequency (8 h, 2000 Hz). (Force refers to the root mean square (rms) force unless otherwise specified and was changed by changing the power applied to the oscillator via an inline power amplifier.) The result was that identical starting gels increased their ΔG' from 1 to 10 kPa as a function of increased applied force from 0.4 N to 1.2 N.

Figure 7C:
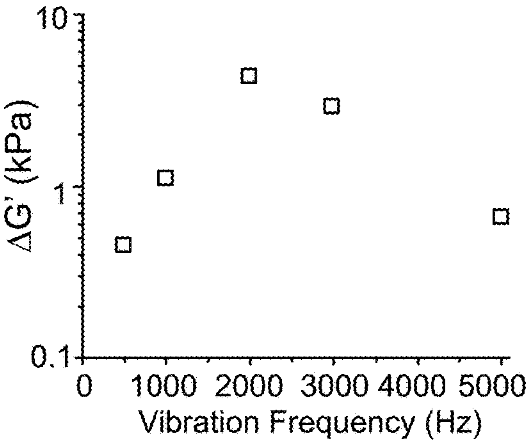

FIG. 7*c* shows how frequency alters modulus. Frequency of oscillation was varied from 500-5000 Hz and each sample was shaken for 8 hrs. The result was the modulus of identical samples changed as a function of input frequency achieving a peak ΔG' at the frequency of 2000 Hz with higher and lower frequencies providing proportional changes in modulus (FIG. 7*c*). While frequency cannot be fully separated from force in an electrohydrodynamic system, in examining the force corresponding to each frequency, it was observed that ΔG' changed for nearly equivalent forces with different frequencies. This indicates that both frequency and force are inputs that the material uses to adapt its modulus.

Figure 7D:
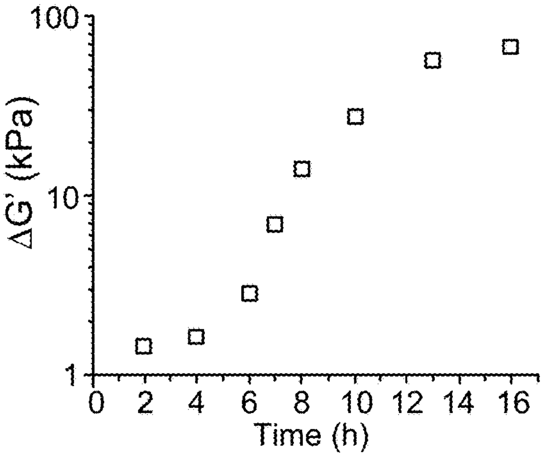

Self-strengthening over time is a hallmark of bone, and the materials described herein exhibit it in certain embodiments. FIG. 7*d* shows ΔG' as a function of vibration time. Before vibrational strengthening, the weak gel showed a G' of 1 kPa. The samples were vibrated at 2000 Hz, 1.2 N for 16 h taking sample data every 2 or 3 h. The resulting materials showed a continuous increase in ΔG' under mechanical vibration overtime (FIG. 7*d*). After 6 hrs, the ΔG' increases quickly and reaches a plateau of 66.6 kPa after 16 h. This result is consistent with observations described above of the formation of higher molecular weight thiol-ene polymer in solution via a step-growth mechanism. It is possible that the sharp increase in ΔG' corresponds to when the crosslinking achieves percolation.

As described above, the adaptive materials described herein may respond to force, frequency, and time of vibration. Each of these parameters alters the modulus of the material with a different relationship—indicating the material adapts its response to different input parameters.

In addition to the bulk responses of the gel compositions, described above, the materials may be characterized by adaptation that differs across a material. The material adapts its structure along the distribution of stress, resembling the bone remodeling behavior that materials can adapt accordingly to the loading location.

Figure 8A:
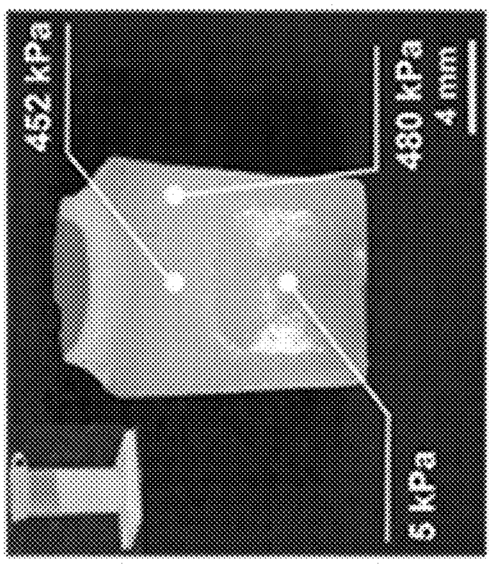
FIGS. 8*a*-8*c* shows images of longitudinal sections of the gel samples of different geometries obtained after vibration.
Figure 8B:
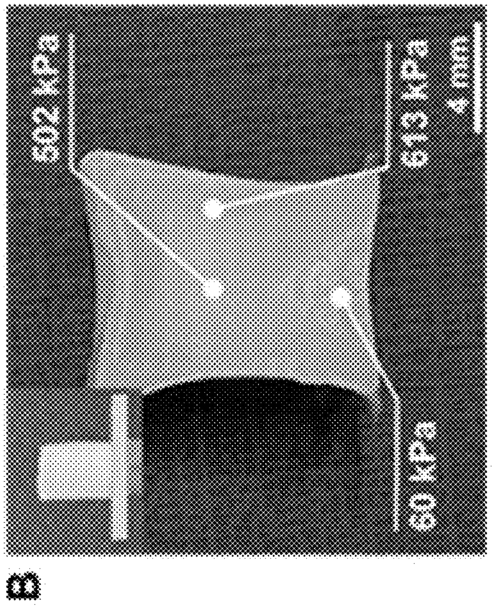
Figure 8C:
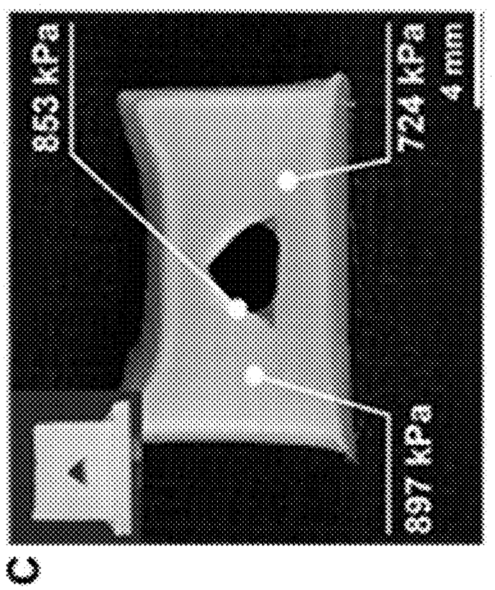

Patterning a material (either intentionally or as a result of environmental conditions) may be performed by varying the stress distributions. FIGS. 8*a*-8*c* shows images of the longitudinal section of the gel samples of different geometries obtained after vibration (2000 Hz, 1.2 N, 13 h). The elastic modulus (E') at test locations are labeled.

Figure 8D:
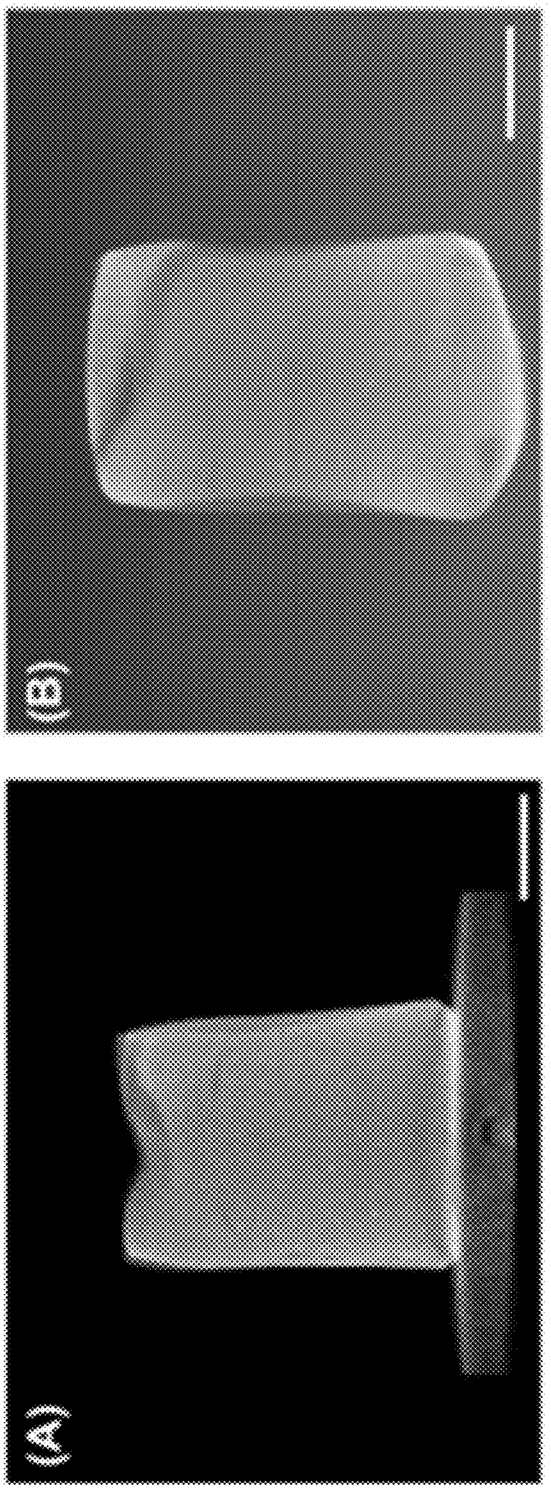
FIG. 8*d* shows an x-ray computed microtomography (μCT) cross-sectional image and a 3-D reconstruction of a cylindrical sample.

FIG. 8*a* shows a sample with two measurements in a perceived hard region and one measurement a in perceived soft region. The two sites within hard region exhibited a high E' of 452 and 480 kPa, about 90 time higher than the soft section (5 kPa). Finite element modeling (FEM) using a material of corresponding stiffness and volume indicate that the material experiences higher stress at the edges of the sample container. The increased stress may promote polymerization locally within regions of the material resulting in differences in both the opacity and stiffness within the sample. The FEM suggested a low stress region at the center of the sample which, when tested experimentally, proved the softest section of the sample. Microtomography revealed that ZnO was evenly distributed throughout sections of the hard and soft regions, indicating that the modulus gradient is the result of different degrees of polymerization and not ZnO accumulation. FIG. 8*d* shows an x-ray computed microtomography (μCT) cross-sectional image of a cylindrical sample (panel A) and a 3D reconstruction of the sample using μCT (panel B).

Altering the stress field alters the response of the material. FIG. 8*b* shows an image of sample without a vial and which was allowed to move freely during vibration. The longitudinal section of the sample shows a much smaller soft region with much higher E' (60 kPa) compared with the one within in the vial shown in FIG. 8*b*.

FIG. 8*c* shows a sample with a complex geometry, a triangular prism cut out of the center of the cuboid gel sample. This creates an extremely high stress at the two bottom vertices according to modeling. "Growth" features via the formation of crosslinked transparent thiol-ene gel near the vertices that experienced the highest stress in the models.

Reversible Organo-Gels

Another aspect of the disclosure are materials that have reversible mechanical adaption. In some embodiments, mechanically-promoted synthesis of gels involves the formation of disulfide linkages between polymers with thiol functionalities. The gels can be dissolved with a reducing agent, and the recovered polymer can be reused to form another gel.

Figure 9A:
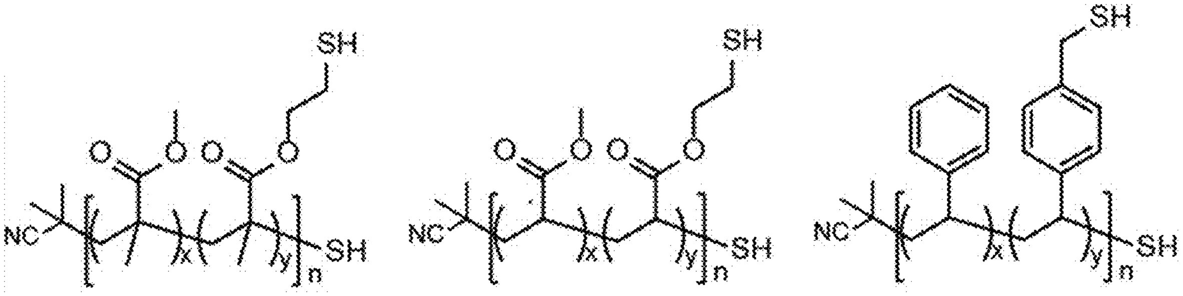
FIG. 9*a* shows examples of linear polymers with thiol side-groups: a polymethacrylate variant (mercapto-PMMA), a poly-acrylate variant (mercapto-PMA) and a polystyrene variant (mercapto-PS).

FIG. 9*a* shows examples of linear polymers with thiol side-groups: a polymethacrylate variant (mercapto-PMMA), a poly-acrylate variant (mercapto-PMA) and a polystyrene variant (mercapto-PS).

Figure 9B:
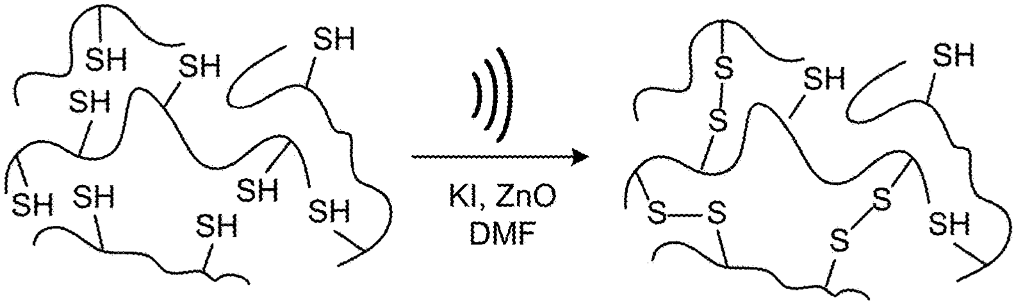
FIG. 9*b* shows a reaction of mercapto-PMMA dissolved in dimethylformamide DMF in the presence of KI and ZnO nanoparticles sonicated in an ultrasound bath.

FIG. 9*b* shows a reaction of mercapto-PMMA dissolved in dimethylformamide DMF in the presence of KI and ZnO nanoparticles sonicated in an ultrasound bath. The piezoelectric nanoparticles under mechanical agitation oxidize iodide anions, promoting the oxidation of thiols to disulfides and the crosslinking of the polymers. The gelation of mercapto-PMMA was confirmed by the inversion test. The gel was allowed to set for 12 h before removing it from the vial. Control experiments were run by selectively removing ZnO and KI with no gel formed in either case. Mercapto-PMA and mercapto-PS were used to form organo-gels by analogous procedures. Other iodide salts such as sodium iodide (NaI) and tetraethylammonium iodide may be used in place of KI.

Table 2, below, shows gelation using different conditions.

| Sample | Polymer | ZnO wt % | Energy source | E (kPa) | Gel fraction |
|---|---|---|---|---|---|
| a | mercapto- | 5.0 | ultrasound | 776 | 93% |
| b | PMMA | 2.5 | ultrasound | 658 | |
| c | | 1.0 | ultrasound | 178 | |
| d | | 5.0 | shaker | 760 | |
| e | | — | heat | 42 | |
| f | mercapto- | 5.0 | ultrasound | 90 | 80% |
| g | PMA | 5.0 | shaker | 2 | |
| h | mercapto- | 5.0 | ultrasound | 570 | 83% |
| i | PS | 5.0 | shaker | 202 | |

Using mercapto-PMMA as a representative polymer, the concentration of ZnO was varied between 5.0, 2.5 and 1.0 w % (samples a-c). In all of these cases, gelation occurred after ultrasonication (40 kHz) for 6 h, however, the elastic moduli of the resulting gels decreased along with the concentration of ZnO. A mercapto-PMMA gel was also formed by mechanical shaking 2 kHz (sample d). Although the frequency of the vibrations was significantly less than in ultrasound, the resulting gel had a comparable elastic modulus to the one synthesized with ultrasound. A reference gel formed with heat (sample e) had an elastic modulus comparable to the gel obtained using 1 w % ZnO concentration (sample c).

For the mercapto-PMA and mercapto-PS polymer systems, organogels were synthesized using both the ultrasound bath and the shaker. The mercapto-PMA gel synthesized with ultrasound (40 kHz) had an elastic modulus almost an order of magnitude lower in comparison to the analogous gel with mercapto-PMMA, though it was still solid. However, the gel synthesized via shaking at 2 kHz showed weak consistency after being removed from the vial. Oscillatory strain and frequency measurements confirmed that the sample was crosslinked, but its elastic modulus was comparatively low at 2 kPa. In the case of mercapto-PS, both 40 kHz ultrasound and 2 kHz shaker yielded consistent gels. However, for the shaker case, the elastic modulus was lower by about half. In general, these results indicate that the lower energy output of the shaker in comparison to the ultrasound leads to lower reactivity and thus lower modulus. A variety of organogels with different moduli are accessible with this methodology.

Swelling experiments in DMF showed a nearly a 5× increase in mass of the mercapto-PMA sample due to solvent absorption, in comparison to the 1.8× and 1.5× increments for mercapto-PMMA and mercapto-PS, respectively. DMA temperature ramp experiments on the gels from −75 to 75° C. showed a rubbery plateau around room temperature for the tested samples a, f, and h. The mercapto-PMMA and mercapto-PS gels showed glass transition temperatures (Tg) at −41° C. and −46° C., respectively. The mercapto-PMA gel showed no glass transition in the measured temperature range. These results suggest that the mercapto-PMMA gel had a higher degree of crosslinking in comparison to the others. Moreover, the mercapto-PMA gel showed more favorable polymer-solvent interactions in DMF, as it is shown to retain a higher volume of solvent. The comparatively low modulus of the mercapto-PMA gel at room temperature can be attributed to the fact that its Tg appears to be considerably lower than for the other gels.

Figure 10:
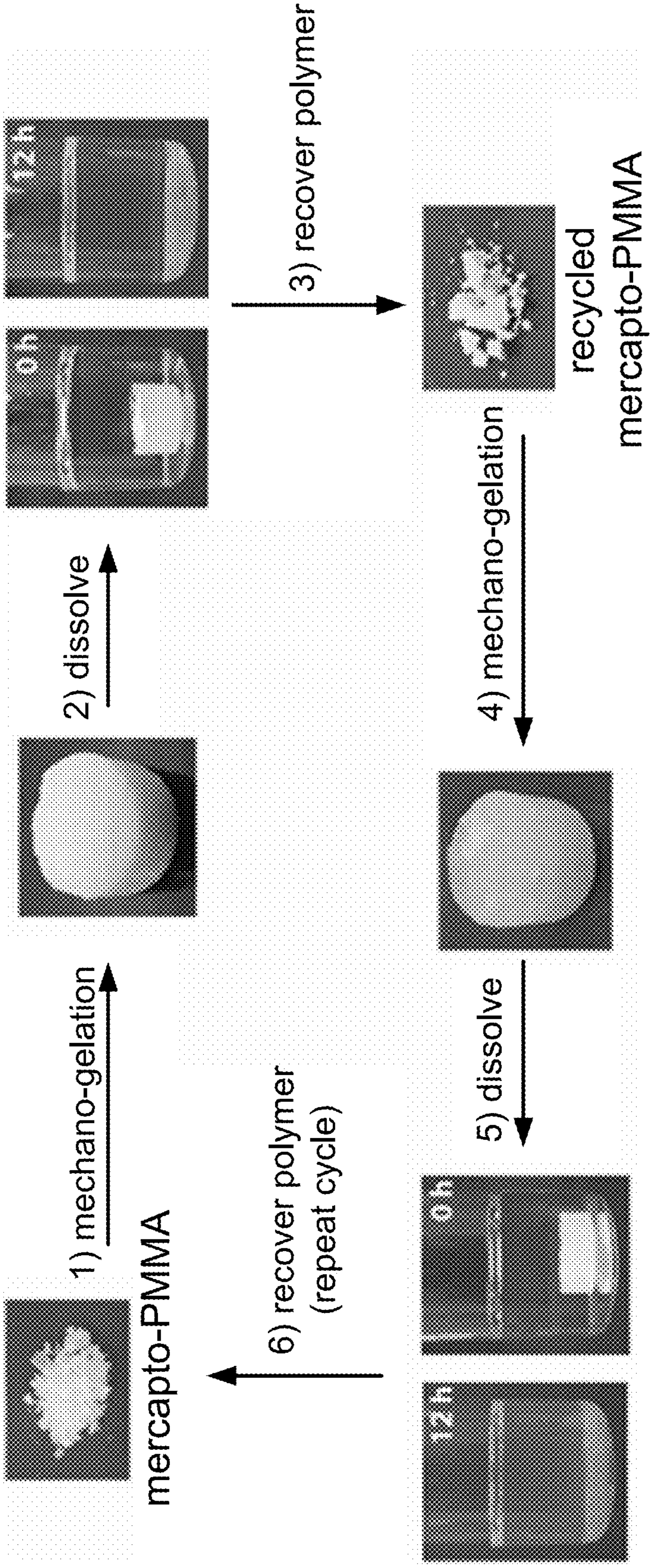
FIG. 10 shows an example of a method including recycling a mercapto-polymer after gel strengthening.

In some embodiments, the disulfide bonds may be reversed by reduction using an agent such as of tris(2-carboxyethyl)phosphine hydrochloride (TCEP). This can allow the polymer to be recycled. An example of recycling mercapto-PMMA is shown in FIG. 10.

In some embodiments, a recycled polymer may contain higher molecular weight species (e.g., from ionic crosslinks that may have formed from solubilized ZnO or irreversible thioether bonds from the desulfurization of sulfides). In such cases, fresh mercapto-polymer may be added to the recycled polymer.

In some embodiments, a mercapto-polymer is crosslinked in the presence of a primary gel as described above. In such embodiments, reversing the disulfide bonds may be used to soften the gel after strengthening.

Mechano-chemical transducers

The mechano-chemical transducer may take any appropriate form. In some embodiments, they are nanostructures including nanoparticles, nanowires, nanotubes, nanotrees, etc. In some embodiments, the mechano-chemical transducer is dispersed substantially homogenously throughout a material. In some embodiments, the mechano-chemical transducer may be localized to allow preferential strengthening in one or more regions of a material. In some embodiments, the mechano-chemical transducer may be attached to a support structure to facilitate localization within a material.

In some embodiments, the mechano-chemical transducers are responsive to ultrasound (above 20,000 hertz (Hz)). In some embodiments, the mechano-chemical transducers are responsive to vibrations at frequencies lower than ultrasound (20,000 Hz and below). In some embodiments, the mechano-chemical transducers are responsive to low-to-mid-range frequencies, e.g., from 10 hertz (Hz) to 6000 Hz. Many commonly encountered vibration sources are within this range. For examples, airplanes and helicopters vibrate at 15-1325 Hz, engines, turbines, and compressors at 400-600 Hz, and household appliances at 25-215 Hz.

Examples of mechano-chemical transducers include piezoelectric materials that are responsive to ultrasound and/or lower frequency vibrations. These include ZnO, gallium nitride (GaN), aluminum nitride (AlN), lithium niobate ($LiNbO_3$), boron nitride (BN), lead zirconate titanate (PZT), barium titanate ($BaTiO_3$), potassium—sodium niobate (KNN), polyvinylidene fluoride (PVDF), polyvinylidene fluoride-trifluoroethylene (PVDF-TrFE), and polyhydroxybutyrate (PHB). In some embodiments, polymer-modified piezoelectric materials may be used. For example, polymer-modified ZnO can be used to increase contact with the monomers. In some embodiments, oxides such as $BaTiO_3$ and ZnO are used.

Figure 11:
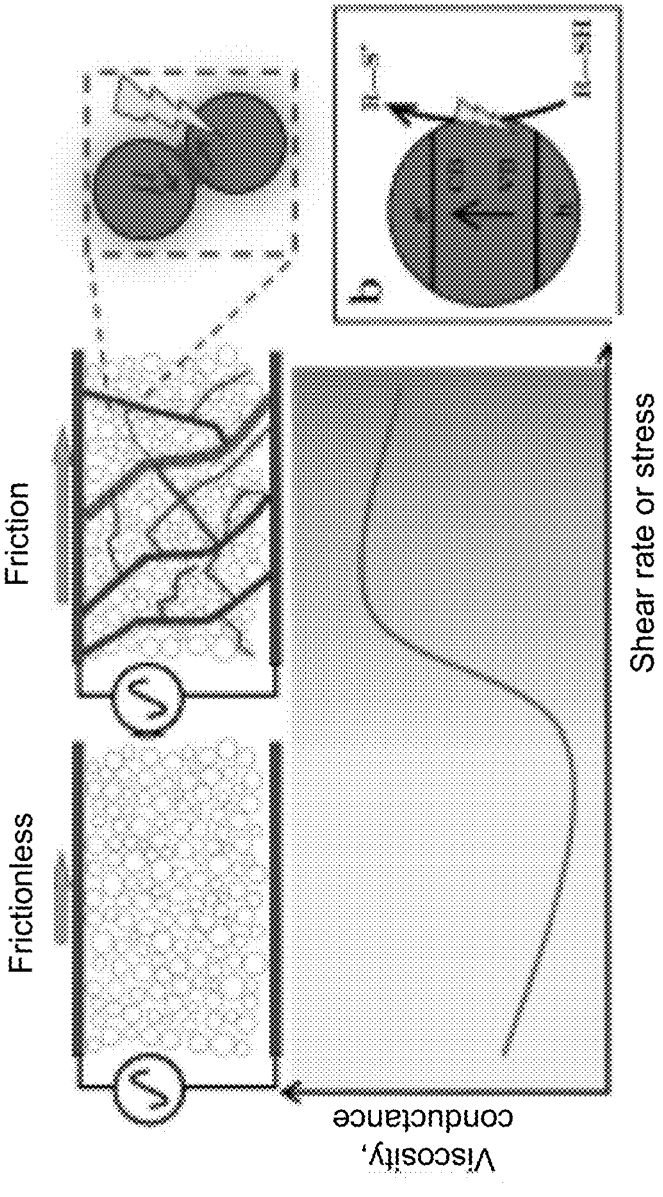
FIG. 11 shows a schematic of a a dense suspension of piezoelectric nanoparticles shear thickens due to a transition from frictionless to frictional particle-particle interactions

In some embodiments, interaction between a surface of the mechano-chemical transducer and a reactive group is important. In such embodiments, only certain piezoelectric materials may be used. For example, in a thiol-ene cross-linking reaction at low to mid-frequency, ZnO particles may be used while $BaTiO_3$ or PZT particles show low reactivity. PVDF and PVDF-TrFE can initiate some reaction (Cu-mediated polymerization) when used as a matrix. Suspensions Any mechanism of applying vibration or friction to piezoelectric nanoparticles or other mechano-chemical transducer may be used. In some embodiments, a dense suspension of piezoelectric nanoparticles is subject to oscillatory shear. FIG. 11 shows a schematic of a dense suspension of piezoelectric nanoparticles shear thickening due to a transition from frictionless to frictional particle-particle interactions under applied external shear. Friction-induced piezoelectricity in the contacting particles generates electric charge, which in turn increases the AC conductance of the surrounding fluid. Charge generation during shear thickening can be used to activate piezochemistry near the nanoparticles, schematically shown for thiol-ene chemistry.

Reaction kinetics can be tuned in-situ, using an applied shear stress to control charge generation of mechano-chemical transducers in in suspension. For example, ZnO particles were dispersed in a monomer mixture of dipentaerythritol-hexakis(3-mercaptopropionate) (DiPETMP) and tri(ethylene glycol) divinyl ether (TEGDE). A low-frequency oscillatory shear ($\omega$=50 rad s−1 and $\gamma$0=80%) transformed the initially viscous fluid into a polymerized solid.

A parallel plate rheometer such as described in "Measurement Techniques for the Shear Dependence of Viscosity at Elevated Pressure," Tribology and Interface Engineering Series Volume 54, 2007, Pages 133-159, and incorporated by reference herein, was used.

This shear thickening approach to driving piezochemistry reactions is energy efficient. The ratio of mechanical input power P to volume V of reactant is estimated as $P/V=(\sigma A)v/V=\sigma\omega\gamma_0$ where 6 is the applied shear stress, the volume V is the product of rheometer plate area A and gap height h, and $v=\omega\gamma_{0\gamma}h$ is the plate velocity amplitude. For example, at $\omega$=50 rad s−1 and $\gamma_0$=80%, $P/V=3.4\ kW/m^3$. This is a factor 7 lower than the power for typical electrodynamic shaking conditions (e.g., 2000 Hz, amplitude 5.3 μm and output force 0.8 N) for which $P/V=21.6\ kW/m^3$. The enhanced efficiency is enabled by the high concentration of piezoelectric particles (70 wt. %) which is not possible in the vibrated systems, which have a low particle concentration (e.g., about 5 wt. %). Increasing $\omega\gamma_0$ toward the maximum of shear thickening, the stress needed and thus the input power eventually exceeds that of the vibrational system due to the significant increase in viscosity, but this comes along with a dramatic increase in the gelation kinetics.

Polymer

The gels described herein can include any useful polymer. In some embodiments, the polymers include thiol reactive groups, e.g., to react in thiol-alkene reaction or disulfide bond reaction. The polymers may include thioether and/or disulfide links. In some embodiments, the polymers include alkene or alkyne reactive groups, e.g., to react in a thiol-alkene reaction.

In addition to sulfur-containing chemistries, any reactive group that can be employed in a free radical initiated polymerization may be used. These include (meth)acrylates, (meth)acrylamides, alkenes, alkynes, vinyl groups, and allyl groups as well as other groups that include unsaturated bonds.

Non-limiting polymer backbones include poly(ethylene oxide) or poly(ethylene glycol) (PEO or PEG), poly(propylene oxide) (PPO), poly(2-hydroxyethyl methacrylate) (pHEMA), poly(vinyl alcohol) (PVA), poly(acrylamide) (PAAm), poly(acrylic acid) (PAA), polymethylmethacrylate (PMMA), and polystyrene (PS).

In some embodiments, the composition may include one or more prepolymers (e.g., monomers or polymeric precursors). Non-limiting examples include vinyl acetate, ethylene glycol, ethylene oxide, acrylic acid, acrylate, acrylamide, vinyl alcohol, poly(ethylene glycol) divinyl ether, poly(ethylene glycol) diacrylate, and the like. In particular embodiments, the prepolymer includes a vinyl group (e.g., $-CH=CH_2$), an acrylate group (e.g., $-O(CO)-CH=CH_2$), a methacrylate group (e.g., $-O(CO)-C(CH_3)=CH_2$), and ethacrylate group (e.g., $-O(CO)-C(CH_2CH_3)=CH_2$), and the like.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A composition comprising:
a polymer network,
reactive groups and/or linkers formed by reaction of the reactive groups,
and a mechano-chemical transducer dispersed in the composition.

2. The composition of claim 1, wherein the reactive groups comprise thiol groups and one or both of alkene and alkyne groups.

3. The composition of claim 2, wherein the linkers comprise thioether groups.

4. The composition of claim 1, wherein the reactive groups comprises thiol groups.

5. The composition of claim 4, wherein the linkers comprises disulfide bonds.

6. The composition of claim 1, wherein the mechano-chemical transducer is a piezoelectric material.

7. The composition of claim 6, wherein the mechano-chemical transducer comprises piezoelectric nanostructures.

8. The composition of claim 7, wherein the piezoelectric nanostructures comprise zinc oxide (ZnO).

9. The composition of claim 1, wherein the mechano-chemical transducer is responsive to ultrasound and/or vibrations at sub-ultrasound frequencies to induce the reaction of reactive groups.

10. The composition of claim 1, wherein the mechanochemical transducer is responsive to vibrations at 10 hertz (Hz) to 6000 Hz to induce the reaction of the reactive groups.

11. The composition of claim 1, wherein the composition is responsive to stress to strengthen selectively according to the distribution of stress in the composition.

12. The composition of claim 1, wherein the polymer network comprises crosslinks formed by reaction of the reactive groups.

13. The composition of claim 12, wherein the composition further comprises a primary polymer network.

14. The composition of claim 13, wherein the primary polymer network comprises methyl-cellulose.

15. The composition of claim 1, wherein the reaction is irreversible.

16. The composition of claim 1, wherein the reaction is reversible.

* * * * *